(12) United States Patent
Scheidle

(10) Patent No.: US 6,653,564 B2
(45) Date of Patent: Nov. 25, 2003

(54) CONDUCTOR STRIP ARRANGEMENT FOR A MOLDED ELECTRONIC COMPONENT AND PROCESS FOR MOLDING

(75) Inventor: Helmut Scheidle, Neuenstadt (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/991,348

(22) Filed: Nov. 20, 2001

(65) Prior Publication Data

US 2002/0062976 A1 May 30, 2002

(30) Foreign Application Priority Data

Nov. 25, 2000 (DE) .......................... 100 58 608

(51) Int. Cl.⁷ ............................................. H01L 23/28
(52) U.S. Cl. ................... 174/52.2; 257/693; 257/734; 257/773
(58) Field of Search .................... 174/52.2, 52.3, 174/52.4; 257/666, 667, 669, 692, 693, 734, 773, 787, 788

(56) References Cited

U.S. PATENT DOCUMENTS

| | | | |
|---|---|---|---|
| 4,309,605 A | | 1/1982 | Okabe |
| 5,018,003 A | * | 5/1991 | Yasunaga et al. ............ 257/791 |
| 5,122,893 A | | 6/1992 | Tolbert |
| 5,349,136 A | | 9/1994 | Abe et al. |
| 5,350,943 A | | 9/1994 | Angerstein et al. |
| 5,506,445 A | | 4/1996 | Rosenberg |
| 5,640,746 A | * | 6/1997 | Knecht et al. ............. 29/25.35 |
| 5,773,322 A | | 6/1998 | Weld |
| 5,841,187 A | | 11/1998 | Sugimoto et al. |
| 6,157,476 A | | 12/2000 | Angerstein et al. |
| 6,281,435 B1 | * | 8/2001 | Maekawa ................. 174/52.2 |
| 6,294,826 B1 | | 9/2001 | Ida et al. |
| 6,301,035 B1 | | 10/2001 | Schairer |
| 6,320,686 B1 | | 11/2001 | Schairer |
| 6,335,548 B1 | | 1/2002 | Roberts et al. |
| 6,417,946 B1 | | 7/2002 | Krieger |

FOREIGN PATENT DOCUMENTS

| | | |
|---|---|---|
| DE | 19508284 | 1/1996 |
| DE | 19536216 | 7/1996 |
| DE | 19653054 | 7/1998 |
| DE | 19755734 | 6/1999 |
| EP | 0680086 | 11/1995 |
| JP | 55071047 | 5/1980 |
| JP | 62149174 | 7/1987 |
| JP | 63306647 | 12/1988 |
| JP | 02105448 | 4/1990 |
| JP | 02137253 | 5/1990 |
| JP | 03175658 | 7/1991 |
| JP | 05109962 | 4/1993 |

\* cited by examiner

Primary Examiner—Dean A. Reichard
Assistant Examiner—Carmelo Oliva
(74) Attorney, Agent, or Firm—W. F. Fasse; W. G. Fasse

(57) ABSTRACT

At least one semiconductor element is located on an electrically conducting conductor strip. Around the conductor strip and the at least one semiconductor element, a housing made of a molding material is arranged such that there are still frame sections of the conductor strip outside the housing. An enlarged frame section of the conductor strip is widened so as to extend into contact with, e.g. directly adjacent to or even protruding into the housing, in order to prevent the formation of a molding flash ridge on this housing surface. The enlarged frame section is finally removed. The avoidance of a molding flash ridge allows the component to be suction-held by a suction needle at this housing surface.

25 Claims, 2 Drawing Sheets

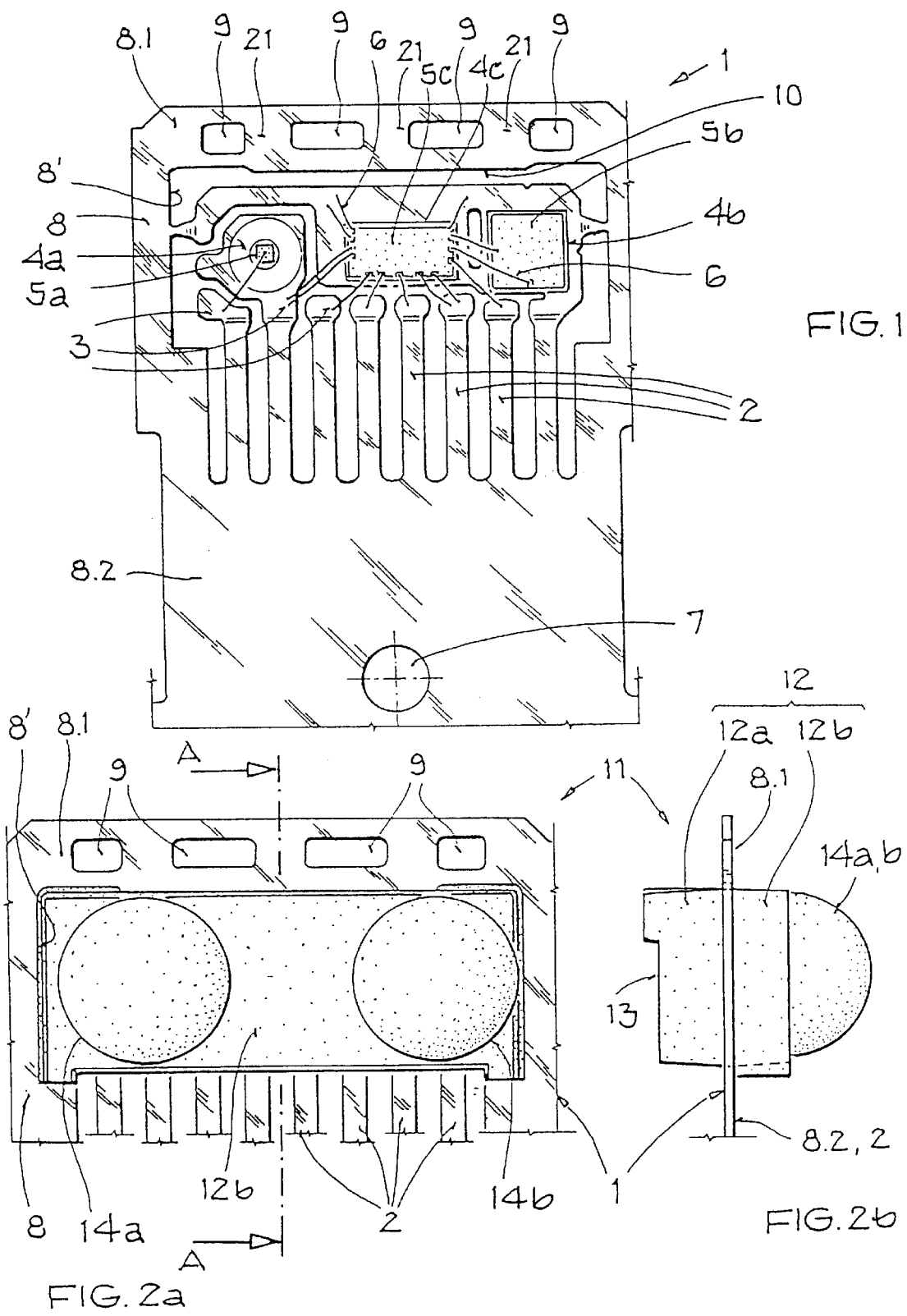

CONDUCTOR STRIP ARRANGEMENT FOR A MOLDED ELECTRONIC COMPONENT AND PROCESS FOR MOLDING

This application is related to U.S. patent application Ser. No. 09/991,346, filed on Nov. 20, 2001.

FIELD OF THE INVENTION

The invention relates to a conductor strip arrangement for a molded electronic component where at least one semiconductor element is located on an electrically conducting conductor strip, and where around the conductor strip and the at least one semiconductor element a housing made of a molding material is arranged such that there are still sections of the conductor strip outside the housing, and a process for molding a housing of an electronic component in a mold form, with the component featuring an electrically conducting conductor strip and connection pins located to one side, and the conductor strip having a frame with frame sections, which forms the lateral boundary between the top and bottom sections of the mold form and whose diameter essentially is slightly larger than the diameter of the actual mold form.

BACKGROUND INFORMATION

Such a molded electronic component is known, for example, from the German patent publication DE 196 53 054 A1. In the case of such molded electronic components, semiconductor chips (optoelectronic transmitter and receiver, integrated circuit for signal processing) are first glued or soldered by machine onto a metal conductor strip and then contacted to one another and with the conductor strip by means of thin gold or aluminum wires. Then, using a mold process, semiconductor chips and conductor strips will in most cases be enveloped by means of a thermoplastic material such as a synthetic resin, for example, thereby creating a housing for the protection of this assembly.

When the housing is manufactured, there remains an edge or protrusion of mold material in the separation plane of the mold form, between the top and bottom sections, which edge is also designated as a "ridge". This is particularly disadvantageous if the ridge runs through that surface of the housing which a suction needle from an automatic assembly machine will be docking onto at a later time, in order to take up the component and place the same onto a printed circuit board, for instance. Due to the ridge the suction needle does not connect tightly but draws in a great deal of external air, thus causing insufficient holding suction for any component to be taken up. In addition, when it is taken up the component will tilt over and assume a tilted and non-definable position on the suction needle. For this reason, an unacceptably large number of components are lost during transportation or are positioned imprecisely.

It is therefore attempted to keep the ridge as small as possible; however, this requires mold tools with very strict tolerances, very precise manufacturing, and additional controls. But these measures lead to significantly increased manufacturing costs without the problem having been really solved.

SUMMARY OF THE INVENTION

It is an object of the invention to develop a conductor strip arrangement for a molded electronic component of the above mentioned general type, such that it can be taken up without difficulty by an automatic assembly machine and placed on a printed circuit board. It is furthermore an object of the invention to provide a process for molding such an electronic component.

According to the invention, the above objects have been achieved by a conductor strip arrangement and a molding process having the following special features.

Particularly, the invention provides a conductor strip arrangement for a molded electronic component where at least one semiconductor element is located on an electrically conducting conductor strip, and where a housing made of a molding material is arranged around the conductor strip and the at least one semiconductor element such that there are still sections of the conductor strip outside the housing, wherein sections of the conductor strip feature a widening such that these widened sections of the conductor strip are directly adjacent to the housing or even protrude somewhat into the housing in order to prevent a mold material ridge from forming on the housing. The widened sections are not embedded and not fixed in the molding material, so that they are free and removable from the molded housing.

The invention further provides a process for molding a housing of an electronic component in a mold form, with the component featuring an electrically conducting conductor strip and connection pins located to one side, and the conductor strip having a frame with frame sections, which forms the lateral boundary between the top and bottom sections of the mold form and whose diameter essentially is slightly larger than the diameter of the actual mold form, wherein a frame section features a widening directly adjacent to the mold form or even protruding somewhat into the mold form in order to prevent the formation of a mold material ridge on the housing. Finally, the widening of the frame section is removed from the housing.

The molded electronic components manufactured in accordance with the invention feature the advantage that they can be take up without difficulty, held securely and placed exactly, by automatic assembly machines without particularly strict tolerances having to be maintained during the production of the molded electronic component or any special tools having to be used for its production.

The invention is particularly suitable for the production of electronic components whose separation plane runs through that housing surface which serves as docking surface for a suction needle from an assembly machine.

In the following the invention will be explained by means of an embodiment example and the drawing.

BRIEF DESCRIPTION OF THE DRAWINGS

FIG. 1: a top view of an assembly consisting of a conductor strip already populated with contacted semiconductor components, FIG. 2a: a top view of an electronic component which comprises the assembly according to FIG. 1 and is additionally provided with a housing, FIG. 2b: a side view onto the electronic component according to FIG. 2a, FIG. 3: a side view onto the electronic component according to FIGS. 2a and 2b during a subsequent production step.

DESCRIPTION OF THE PREFERRED EMBODIMENTS

Figure 3:
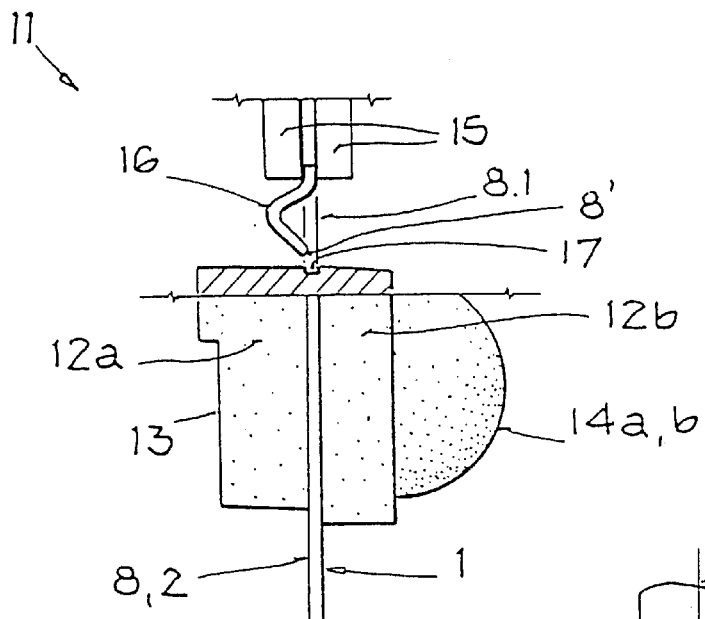

FIG. 1 shows a conductor strip 1 which, for example, consists of a copper alloy and is punched or etched out in a known fashion from thin sheet metal.

Also by punching or etching, a large number of connection pins 2 with bond surfaces 3 and assembly surfaces 4a, 4b, and 4c for electronic or optoelectronic semiconductor components 5a, 5b, and 5c are formed. The semiconductor components 5a, 5b, and 5c—by means of an adhesion material such as for example a solder or a conducting adhesive—are attached material-positively to the assembly surfaces 4a, 4b, and 4c of the conductor strip 1.

The semiconductor component 5a, for example, is an optoelectronic transmitter, semiconductor component 5b, for example, is an optoelectronic receiver, and the semiconductor component 5c, for example, is an integrated circuit for processing the electric signals output by the optoelectronic receiver 5b. The semiconductor components 5a, 5b, and 5c are connected to one another, or with the bond surfaces 3 of the connection pins 2, by means of thin bond wires 6 made up of an aluminum or gold alloy.

Furthermore, the conductor strip 1 features a frame 8 with an inner boundary 8' and frame sections 8.1 and 8.2. The frame section 8.2 is provided with a positioning and transport aperture 7 in the form of a round hole, and frame section 8.1 is provided with apertures 9 in the form of longitudinal holes, with lands 21 being located between the apertures 9. In addition, frame section 8.1 features a widening 10. The meaning and purpose of the apertures 9, lands 21, and widening 10 are described below.

During the mold process, frame 8 is located between the top and bottom sections of the mold form. Its inner boundary 8' here rune around the mold form proper, as it has a slightly larger diameter or inner clear dimension than the later housing 12 (FIG. 2a, b) produced by the mold form.

The FIGS. 2a and 2b show an as yet uncompleted electronic component 11 comprising the assembly shown in FIG. 1 for the directed bidirectional optical data transmission at a later stage of production. Such a component 11 is also designated as a transceiver (from Transmitter and Receiver). In order to produce a protective housing 12, the semiconductor components 5a–c (FIG. 1) and the bond wires 6 (FIG. 1) were enveloped with a thermoplastic synthetic material such as a synthetic resin (transparent for a specific wavelength range) by means of a mold process.

Here the housing 12 consists of two sections: a first housing section 12a with a recess 13 (into which the connection pins 2 protrude later, FIG. 4) and a second housing section 12b. From the plane between the two housing sections 12a and 12b, there protrude the parts of conductor strip 1 that have not yet been removed. The first housing section 12a is the side of component 11 facing a printed circuit board (assembly side); the second housing section 12b contains the two bulges 14a or 14b, which are arranged as lenses before transmitter 5a (FIG. 1) or receiver 5b (FIG. 1).

FIG. 3 shows a side view of the electronic component 11 according to FIGS. 2a and 2b during a subsequent production step. Parts of conductor strip 1 that are no longer required are removed by punching or cutting, and thus, for example, the connection pins 2 are shortened to their final length.

Figure 5:
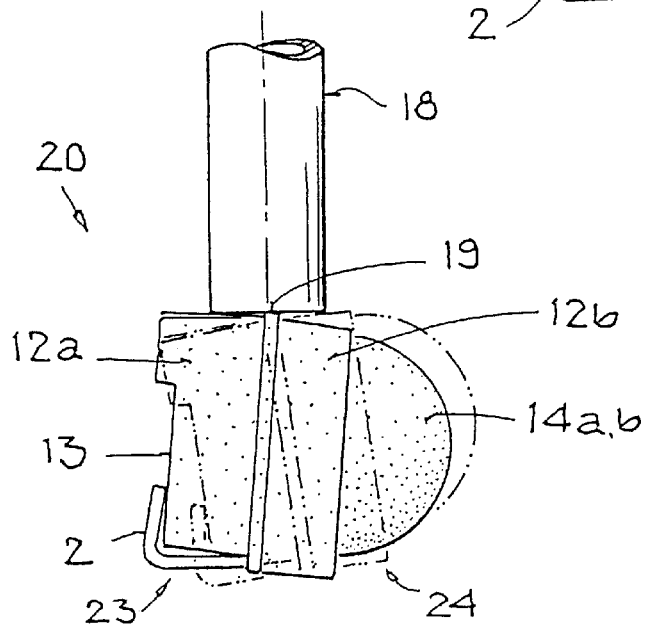
FIG. 5: an electronic component according to the state of the art.

In the case of molded electronic components of this general type according to the prior art, the frame 8 of the conductor strip 1 is spaced a distance away from the housing 12. Therefore, during the molding process, a mold material ridge (synthetic resin) forms as flash along the mold parting plane. This ridge can later only be somewhat reduced at great effort and cost but not completely removed, thus causing major difficulties during picking-up of the component by an assembly machine (FIG. 5).

The invention, however, provides for the frame 8—with its inner boundary 8' to be directly adjacent to the area of the later housing 12, even protruding somewhat into the area of the later housing 12, so that the formation of a ridge at this point is prevented; this is the purpose of the widening 10 of frame section 8.1.

In order to be able to take out component 11 from the parts of conductor strip 1 that have not yet been removed, for example by pressing out with a small lever press, without this being prevented by the widening 10 of conductor strip 1 possibly protruding into housing 12, and without housing 12 being damaged thereby, the conductor strip 1 is held by a holding device 15 in the area of frame section 8.1, and frame section 8.1 is then re-shaped mechanically, for example by embossing, so as to produce therein a deformation 16, such as shown here for example in the form of a V-shaped bead.

It is advantageous if frame section 8.1 is provided with apertures 9, for example in the form of longitudinal holes. These longitudinal holes 9 weaken the material of frame section 8.1, such that the deformation 16 can be produced at reduced force and exactly along the lands 21 between these longitudinal holes 9.

By producing the deformation 16 the frame section 8.1 is pulled away from the housing 12 (in an ideal case) or, in a case which is not ideal, drawn out from housing 12, thus creating at that point a narrow and flat recess (groove) 17. The expert with relevant training will know that, instead of the V-shaped bead shown here it is possible to produce for example a U-shaped bead or any other mechanical deformation 16 in any given fashion such that frame section 8.1 will be deformed, thus creating an intermediate space between frame section 8.1 and housing 12.

The ideal case occurs if the widening 10 of frame section 8.1 and housing 12 are still just about in contact, i.e. when the inner edge of the widening 10 is directly adjacent to or adjoining the outer plane surface of the housing 12. If, in a non-ideal case, the widening 10 of frame section 8.1 is somewhat wider or if the housing 12 is somewhat offset during molding or produced to a somewhat larger size, then frame section 8.1 will in some small measure protrude with the widening 10 into the housing 12. When producing the deformation 16, the above-mentioned recess 17 is created in housing 12 by drawing frame section 8.1 out from the housing 12. Thus, it should be understood that the widening 10 of frame section 8.1 is not permanently and fixedly embedded in the molded material forming the housing 12, so that it remains free and removable from the molded housing 12.

Figure 4:
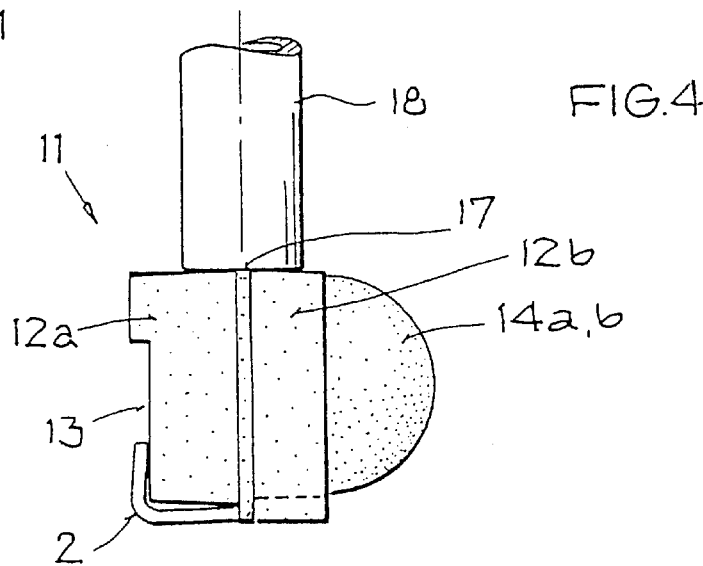
FIG. 4: the electronic component finished in accordance with the process stated by the invention.

However, such a recess 17 only represents a minor "appearance defect" and does not have any further negative effects, as even in spite of a recess 17 a suction needle 18 (FIG. 4) will connect flush to the housing 12, and as the recess 17, which has the effect of a thin, flat channel running across the relevant surface area of housing 12, will only cause a very low volume of external air to be drawn in. This only leads to an almost unnoticeable force reduction by means of which such a component 11 is taken up by the suction needle 18 (FIG. 4). However, there will not be any tilting of component 11.

FIG. 4 shows the electronic component 11 finished in accordance with the process stated by the invention. The connection pins 2 are bent and protrude into the recess 13. The remaining parts of conductor strip 1 arranged outside the housing 12, in particular frame 8, have been removed. The suction needle 18 of an automatic assembly machine (not shown here) can now take up, by suction, component 11 on the smooth surface area opposite to the assembly side of housing 12 without any difficulty, securely hold and exactly place the same onto a printed circuit board, for example, without any possible recess 17 having any negative effect.

Finally, FIG. 5 shows a molded electronic component 20 according to the state of the art. A ridge 19 on the surface area opposite to the assembly side, which is formed during molding in the separation surface area of the mold tool between the housing sections 12a and 12b, causes a distance to appear between the suction needle 18 and the housing 12, such that the component 20 is not held at all or with reduced force and in tilted fashion only. In an unacceptably large number of cases, this has the consequence that the component 20 assumes a tilted position on suction needle 18, for example one of the mis-positions 23 or 24 shown here, and is thus imprecisely positioned on the printed circuit board, necessitating manual and thus costly reworking. Furthermore, another consequence frequently is that the component 20 is not taken up or is lost during transportation.

The device and the process according to the invention provide for the ridge-free production of such surfaces of an electronic component which serve as docking surfaces for the suction needle of an assembly machine.

What is claimed is:

1. A conductor strip arrangement for a molded electronic component (11), comprising at least one semiconductor element (5a–c) located on an electrically conducting conductor strip (1), and a housing (12) made of a molding material arranged around the conductor strip (1) and the at least one semiconductor element (5a–c) such that there are still sections (8) of the conductor strip (1) outside the housing (12), wherein a widened section (8.1) among the sections of the conductor strip (1) features a widening (10) such that the widened section (8.1) of the conductor strip (1) contacts an outer surface of housing (12) so as to prevent a mold material ridge (19) from being formed on the outer surface of the housing (12) at a location of the widened section, and wherein the widened section is not fixedly embedded in the housing so as to be free and removable from the housing.

2. The conductor strip arrangement according to claim 1, wherein the widened section (8, 8.1) of the conductor strip (1) features apertures (9).

3. The conductor strip arrangement according to claim 2, wherein lands (21) are located between the apertures (9).

4. The conductor strip arrangement according to claim 2, wherein the apertures (9) are implemented as longitudinal holes.

5. The conductor strip arrangement according to claim 1, wherein an edge of the widened section is directly adjacent to and flushly contacts the outer surface of the housing.

6. The conductor strip arrangement according to claim 1, wherein an edge portion of the widened section projects through the outer surface of the housing and into the molding material that forms the housing.

7. A process for molding a housing (12) of an electronic component (11) in a mold form, with the component (1) featuring an electrically conducting conductor strip (1) having connection pins (2) located to one side, and having a frame (8) including frame sections (8.1, 8.2) that is arranged to form the lateral boundary between top and bottom sections of the mold form and that has a transverse dimension slightly larger than a transverse dimension of the mold form, and comprising a step of molding a mold material around at least a portion of the electronic component in a mold cavity of the mold form to form the housing of the mold material, wherein a widened frame section (8.1) among the frame sections of the frame features a widening (10) that extends inwardly toward the electronic component sufficiently to at least reach a side boundary wall of the mold cavity of the mold form in order to prevent the formation of a mold material ridge (19) on the housing (12), and further comprising a step of removing the widened frame section from the housing.

8. The process according to claim 7, further comprising mounting the at least one semiconductor element (5a–c) on the conductor strip (1) by means of solder or an electrically conductive adhesive.

9. The process according to claim 7, further comprising electrically contacting the at least one semiconductor element (5a–c) and the conductor strip (1) with each other by means of bond wires (6) made of an aluminum or gold alloy.

10. The process according to claim 7, wherein the mold material is a synthetic material that is transparent within a specific wavelength range.

11. The process according to claim 7, wherein the step of removing the widened frame section from the housing (12) comprises a step of mechanically deforming the widened frame section so as to pull the widened frame section away from the housing.

12. The process according to claim 11, wherein the step of mechanically deforming the widened frame section (8.1) comprises embossing a deformation (16) therein.

13. The process according to claim 12, wherein the embossing of the deformation (16) is facilitated by providing apertures (9) in the widened frame section (8.1) of the conductor strip (1).

14. The process according to claim 11, wherein the deformation (16) is manufactured as a bead.

15. The process according to claim 11, wherein the deformation (16) is manufactured as a V-shaped bead.

16. The process according to claim 7, wherein the widened frame section is configured and arranged so that an edge of the widened frame section is directly adjacent to and flush with the side boundary wall of the mold cavity of the mold form.

17. The process according to claim 7, wherein the widened frame section is configured and arranged so that an edge portion of the widened frame section projects into the mold cavity of the mold form and is surrounded by the mold material during the molding step.

18. A molded electronics arrangement comprising:
an electrically conductive conductor strip including a chip mount section and frame sections around at least a portion of a perimeter of said chip mount section with frame spacing gaps between said chip mount section and said frame sections;
a semiconductor element mounted on said chip mount section of said conductor strip; and
a housing made of a molded material that is molded around said semiconductor element and said chip mount section of said conductor strip, and with said molded material also received in said spacing gaps;
wherein said frame sections include a projecting frame section that has an inner frame edge that projects toward said chip mount section, said frame spacing gaps include a projecting frame spacing gap defined between said chip mount section and said inner frame edge of said projecting frame section, said inner frame edge at least reaches a major outer surface of said housing and contacts said molded material, and said projecting frame section is not fixedly embedded in said molded material so as to be free and removable from said housing.

19. The molded electronics arrangement according to claim 18, wherein said inner frame edge is flush with and just contacts said major outer surface of said housing.

20. The molded electronics arrangement according to claim 19,
further comprising a mold including a first mold half and a second mold half enclosing a mold cavity therebetween;
and wherein:
said frame sections are arranged and held along a parting plane between said first mold half and said second mold half;
said chip mount section, said semiconductor element and said housing are received in said mold cavity; and
said inner frame edge flushly borders said mold cavity without projecting into said mold cavity.

21. The molded electronics arrangement according to claim 18, wherein said projecting frame section projects through said major outer surface of said housing, and said inner frame edge is recessed into said molded material forming said housing.

22. The molded electronics arrangement according to claim 21,
further comprising a mold including a first mold half and a second mold half enclosing a mold cavity therebetween;
and wherein:
said frame sections are arranged and held along a parting plane between said first mold half and said second mold half;
said chip mount section, said semiconductor element and said housing are received in said mold cavity; and
said inner frame edge projects into said mold cavity.

23. A method of making and further processing the molded electronics arrangement according to claim 18, comprising the steps:

a) providing said semiconductor element mounted on said chip mount section of said electrically conductive conductor strip;

b) arranging said conductor strip with said frame sections received along a parting plane between a first mold half and a second mold half defining therebetween a mold cavity containing said semiconductor element mounted on said chip mount section, wherein said mold halves include a cavity bounding wall that bounds said mold cavity;

c) closing said first and second mold halves to close said mold cavity, wherein said conductor strip is positioned relative to said mold halves so that a cavity spacing gap between said chip mount section and said cavity bounding wall adjacent to said projecting frame section is at least as large as said projecting frame spacing gap;

d) injecting said molded material into said mold cavity to mold said molded material around said semiconductor element and said chip mount section to form said housing, wherein said cavity bounding wall molds and forms said major outer surface of said housing;

e) opening said mold halves and removing said molded electronics arrangement; and f) removing said projecting frame section from said housing.

24. The method according to claim 23, wherein said inner frame edge is flush with said cavity bounding wall without projecting into said mold cavity and said cavity spacing gap is equal to said projecting frame spacing gap in said step c).

25. The method according to claim 23, wherein said projecting frame section projects beyond said cavity bounding wall with said inner frame edge protruding into said mold cavity and said cavity spacing gap is greater than said projecting frame spacing gap in said step c).

* * * * *